(12) United States Patent
Chang

(10) Patent No.: US 6,442,633 B1
(45) Date of Patent: Aug. 27, 2002

(54) REDUCED TRANSISTORS DATA SWITCH PORT WHEREIN EACH OF A PLURALITY OF TRANSMISSION GATES IS COUPLED TO BOTH FIRST AND SECOND CONTROL SIGNALS FOR SELECTIVELY ENABLING

(75) Inventor: Augustine W. Chang, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/275,279

(22) Filed: Mar. 23, 1999

(51) Int. Cl.[7] .............................................. G06F 13/14
(52) U.S. Cl. ...................... 710/131; 327/337; 327/365; 327/423; 327/434
(58) Field of Search .............................. 710/8, 10, 131, 710/132; 709/213, 238; 370/351, 360, 377; 327/334, 337, 365, 423, 424, 434

(56) References Cited

U.S. PATENT DOCUMENTS

| | | | |
|---|---|---|---|
| 5,274,766 A | * 12/1993 | Long et al. ................... 710/14 |
| 5,291,585 A | 3/1994 | Sato et al. | |
| 5,335,320 A | 8/1994 | Iwata et al. | |
| 5,345,550 A | 9/1994 | Bloomfield | |
| 5,347,627 A | 9/1994 | Hoffmann et al. | |
| 5,384,911 A | 1/1995 | Bloomfield | |
| 5,412,772 A | 5/1995 | Monson | |
| 5,414,806 A | 5/1995 | Richards | |
| 5,423,034 A | 6/1995 | Cohen-Levy et al. | |
| 5,430,836 A | 7/1995 | Wolf et al. | |
| 5,436,637 A | 7/1995 | Gayraud et al. | |
| 5,448,695 A | 9/1995 | Douglas et al. | |
| 5,461,399 A | 10/1995 | Cragun | |
| 5,461,710 A | 10/1995 | Bloomfiled et al. | |
| 5,473,745 A | 12/1995 | Berry et al. | |
| 5,491,784 A | 2/1996 | Douglas et al. | |
| 5,493,638 A | 2/1996 | Hooper et al. | |
| 5,509,116 A | 4/1996 | Hiraga et al. | |
| 5,526,517 A | 6/1996 | Jones et al. | |
| 5,544,288 A | 8/1996 | Morgan et al. | |
| 5,546,519 A | 8/1996 | Berry | |
| 5,548,702 A | 8/1996 | Li et al. | |
| 5,550,968 A | 8/1996 | Miller et al. | |
| 5,559,942 A | 9/1996 | Gough et al. | |
| 5,564,003 A | 10/1996 | Bell et al. | |
| 5,566,330 A | 10/1996 | Sheffield | |
| 5,570,462 A | 10/1996 | McFarland | |
| 5,572,643 A | 11/1996 | Judson | |
| 5,694,603 A | 12/1997 | Reiffin | |
| 5,694,604 A | 12/1997 | Reiffin | |
| 6,035,345 A | * 3/2000 | Lee ................................ 710/8 |
| 6,038,630 A | * 3/2000 | Foster et al. ................. 710/132 |
| 6,127,855 A | * 10/2000 | Taft et al. ...................... 327/91 |

OTHER PUBLICATIONS

Ronald L. Johnston, "The Dynamic Incremental Compiler of APL/3000" Proceedings of the API '79 Conference, published as APL Quote Quad, 9(4), pp. 82–87.

Leo J. Guibas et al., "Compilation and Delayed Evaluation in APL," Fifth Annual Synposium on Principles in Programming Languages, pp. 1–8, 1978.

Gleen Krasner "The Smalltalk–80 Virtual Machine" BYTE Publications Inc., Aug. 1991, pp. 300–320.

* cited by examiner

*Primary Examiner*—Thomas Lee
*Assistant Examiner*—Thuan Du
(74) *Attorney, Agent, or Firm*—Gunnison, McKay & Hodgson, L.L.P.; Philip J. McKay

(57) ABSTRACT

A high density, high speed, and low power circuit scheme is presented for vector switching port applications for advanced IC design. Embodiments exhibit superior area-delay-power properties. The technique benefits a wide range of product applications ranging from high speed high bandwidth router to low power portable computing hardware. 5.0 TBPS peak traffic can be supported for an on-chip vector port.

6 Claims, 4 Drawing Sheets

REDUCED TRANSISTORS DATA SWITCH PORT WHEREIN EACH OF A PLURALITY OF TRANSMISSION GATES IS COUPLED TO BOTH FIRST AND SECOND CONTROL SIGNALS FOR SELECTIVELY ENABLING

BACKGROUND OF THE INVENTION

1. Field of the Invention

This invention relates to the field of circuits.

Portions of the disclosure of this patent document contain material that is subject to copyright protection. The copyright owner has no objection to the facsimile reproduction by anyone of the patent document or the patent disclosure as it appears in the Patent and Trademark Office file or records, but otherwise reserves all copyright rights whatsoever. Sun, Sun Microsystems, the Sun logo, Solaris, Java, JavaOS, JavaStation, HotJava Views and all Java-based trademarks and logos are trademarks or registered trademarks of Sun Microsystems, Inc. in the United States and other countries.

2. Background Art

Computer systems are comprised of components that consist of millions of integrated circuits. Computer system performance can sometimes be greatly improved by improving the performance of individual circuits. One type of circuit in a computer system is referred to as a two-way data port. Current data port circuits are complex and have a relatively large number of transistors. It is desired to reduce the number of devices in a data port to improve the performance of data port circuits.

Data Port Operation

A data port is a circuit that has two inputs (A and B) and produces two outputs (D and E). The data port can be configured to have the data on the A input passed to the D output, with the data on the B input passed to the E output, or the data port can be configured to have the data on the A input passed to the E output, with the data on the B input passed to the D output. The operation of the data port is controlled by an input control signal C that determines the input/output configuration of the data port.

The logical configuration of a two way data port is illustrated in FIG. 1. Referring to FIG. 1, a two way data port 100 is shown with A and B inputs 101 and 102 respectively. The D and E are shown as outputs 104 and 105 respectively. The control signal C is shown as signal 103. In the embodiment shown, when signal C is asserted, the A and B inputs are routed to outputs D and E respectively. When the inverse of signal C is asserted, the A and B inputs are routed to outputs E and D respectively.

Prior Art Circuit Implementations

First Prior Art Embodiment—FIG. 2 is an example of a first prior art implementation of the two way data port of FIG. 1. Input signal A is coupled through inverter 202 to the input of standard cell circuit 203.1 and to the input of standard cell circuit 203.4. Input B is coupled through inverter 206 to the input of standard cell 203.2 and to the input of standard cell 203.3.

The outputs of standard cells 203.1 and 203.2 are coupled to D output 204. The outputs of standard cells 203.3 and 203.4 are coupled to E output 205. Standard cells 203.1 and 203.3 are enabled by signal CI 210, and standard cells 203.2 and 203.4 are controlled by signal CB 211. These signals are created when C input 207 is provided through inverter 208 to yield signal CB 211 and again through inverter 209 to yield signal CI 210. When C input 207 is high, signal CI 210 is high and signal CB 211 is low. This enables standard cells 203.1 and 203.3 while disabling 203.2 and 203.4. As a result, input A is coupled to output D and input B is coupled to output E.

When C input 207 is low, signal CI 210 is low and signal CB 211 is high. This enables standard cells 203.2 and 203.4, disabling 203.1 and 203.3. As a result, input A is now coupled to output E and input B is coupled to output D.

Each standard cell 203.1 through 203.4 of FIG. 2 is implemented with the circuit of FIG. 3. FIG. 3 comprises PMOS transistors M1–M7 and NMOS transistors M8–M14. The sources of PMOS transistors M1, M2 and M4–M7 are coupled to the upper voltage reference node. The sources of NMOS transistors M8, and M10–M14 are coupled to the lower voltage reference node. Input E is applied to the gates of PMOS transistors M1 and M5 and NMOS transistors M9 and M11. Input A is applied to the gates of PMOS transistor M4 and NMOS transistor M14. Output node A' (Y) is formed by the coupled drains of PMOS transistor M7 and NMOS transistor M8. The drains of PMOS transistor M1 and NMOS transistor M11 are coupled to the gates of PMOS transistor M2 and NMOS transistor M12 to form node 4. The drains of PMOS transistor M4 and NMOS transistor M14 are coupled to the gates of PMOS transistors M3, M6, M13 and NMOS transistor M10 to form node 5. The drain of PMOS transistor M2 is coupled to the source of PMOS transistor M3 to form node 13, and the drains of PMOS transistor M3 and NMOS transistor M12 are coupled to the gate of NMOS transistor M8 and the drain of NMOS transistor M13 to form node 2. The drains of PMOS transistors M5 and M6 and NMOS transistor M9 are coupled to the gate of PMOS transistor M7 to form node 6. The source of NMOS transistor M9 is coupled to the drain of NMOS transistor M10 to form node 12.

A disadvantage of the circuit of FIG. 3 is that each standard cell uses 14 transistors. With four cells in the data port, 56 transistors are required for each data port. The cell is a tristate circuit and is inherently a poor driver. It uses larger area, more stages of delays, higher input capacitance, and is vulnerable to CB/CI skew induced transient current contentions.

Second Prior Art Embodiment—FIG. 4 illustrates a second prior art two way data port embodiment. The A input is coupled through inverter 402 to produce signal 405 coupled to the first input of standard cell 403.1 and to the second input of standard cell 403.2. The B input is coupled through inverter 404 to produce signal 406 coupled to the first input of cell 403.2 and to the second input of cell 403.1. Signal CI selects the first input of cells 403.1 and 403.2, while signal CB selects the second input of cells 403.1 and 403.2. The output of cell 403.1 is D output 407 and the output of cell 403.2 is E output 408.

When signal CI is enabled, the first input of cells 403.1 and 403.2 is selected so that the A input is coupled to the D output 407 and the B input is coupled to the E output 408. When signal CB is enabled, the second input of cells 403.1 and 403.2 is enabled so that the A input is coupled to the E output 408 and the B input is coupled to the D output 407.

Each of cells 403.1 and 403.2 is comprised of the circuit of FIG. 5. FIG. 5 comprises PMOS transistors M1–M4 and NMOS transistors M5–M8. The sources of PMOS transistors M1 and M2 are coupled to the upper voltage reference node. The drains of PMOS transistors M1 and M2 are coupled to the sources of PMOS transistors M3 and M4 to form node 7. The drains of PMOS transistors M3 and M4 are coupled to the drains of NMOS transistors M6 and M7 to form output node Y. The sources of NMOS transistors M6 and M7 are coupled to the drains of transistors M5 and M8, respectively, and the sources of transistors M5 and M8 are coupled to the lower voltage reference node. Input A is applied to the gates of transistors M3 and M7, input B is applied to the gates of transistors M4 and M8, input C is applied to the gate of transistors M2 and M6, and input D is applied to the gates of transistors of M1 and M5.

A disadvantage of the circuit of FIG. 5 is the number of transistors. With two cells required, a total of 16 transistors is required for the data port. Also, the circuit is a poor driver. It involves two NTx or PTx for tf or tr switching. It also has double input gate load to the previous stage.

SUMMARY OF THE INVENTION

The present invention provides a best circuit configuration for data port solutions. One embodiment uses a pair of transmission gates as bridges to realize 2×2×D (M×N×D) logic switching in high speed (on the order of 5.0 TBPS) data switch ports. The simplicity of the circuit guarantees the physical closeness of the internal switching nodes D and E to their respective drivers. It also means least capacitance for those nodes. This circuit technique insures a high density, high speed, low power solution for any data port switching. The technique benefits a wide range of product applications ranging from high speed high bandwidth router to low power portable computing hardware.

DETAILED DESCRIPTION OF THE INVENTION

The invention is a method and apparatus for a data switch port. In the following description, numerous specific details are set forth to provide a more thorough description of embodiments of the invention. It is apparent, however, to one skilled in the art, that the invention may be practiced without these specific details. In other instances, well known features have not been described in detail so as not to obscure the invention.

Figure 1:
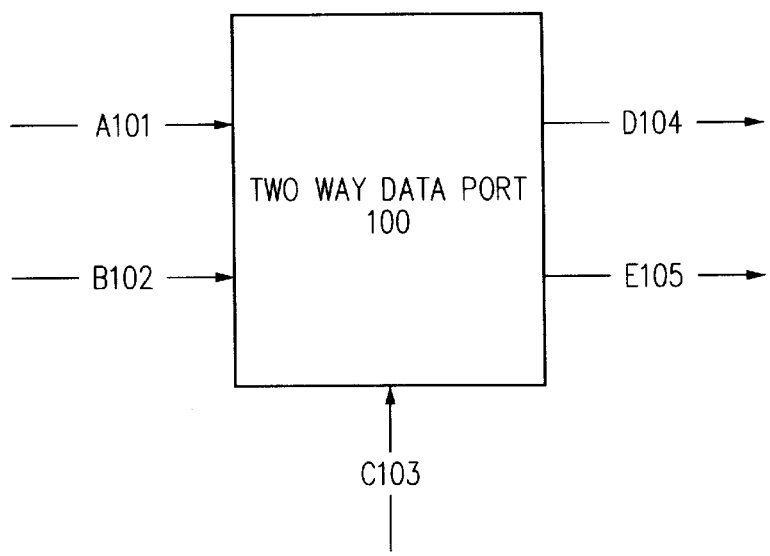
FIG. 1 illustrates a two way data port.
Figure 2:
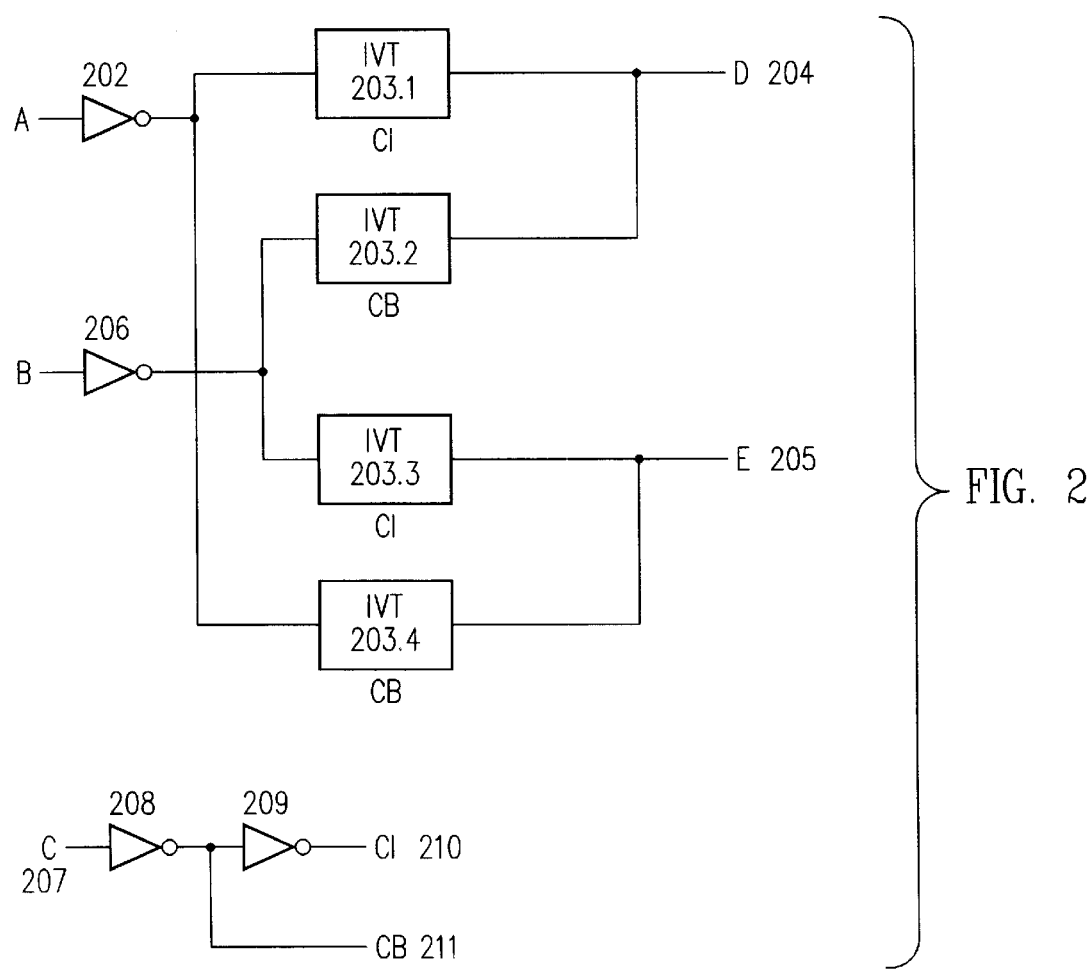
FIG. 2 illustrates a first prior art embodiment of a two way data port.
Figure 3:
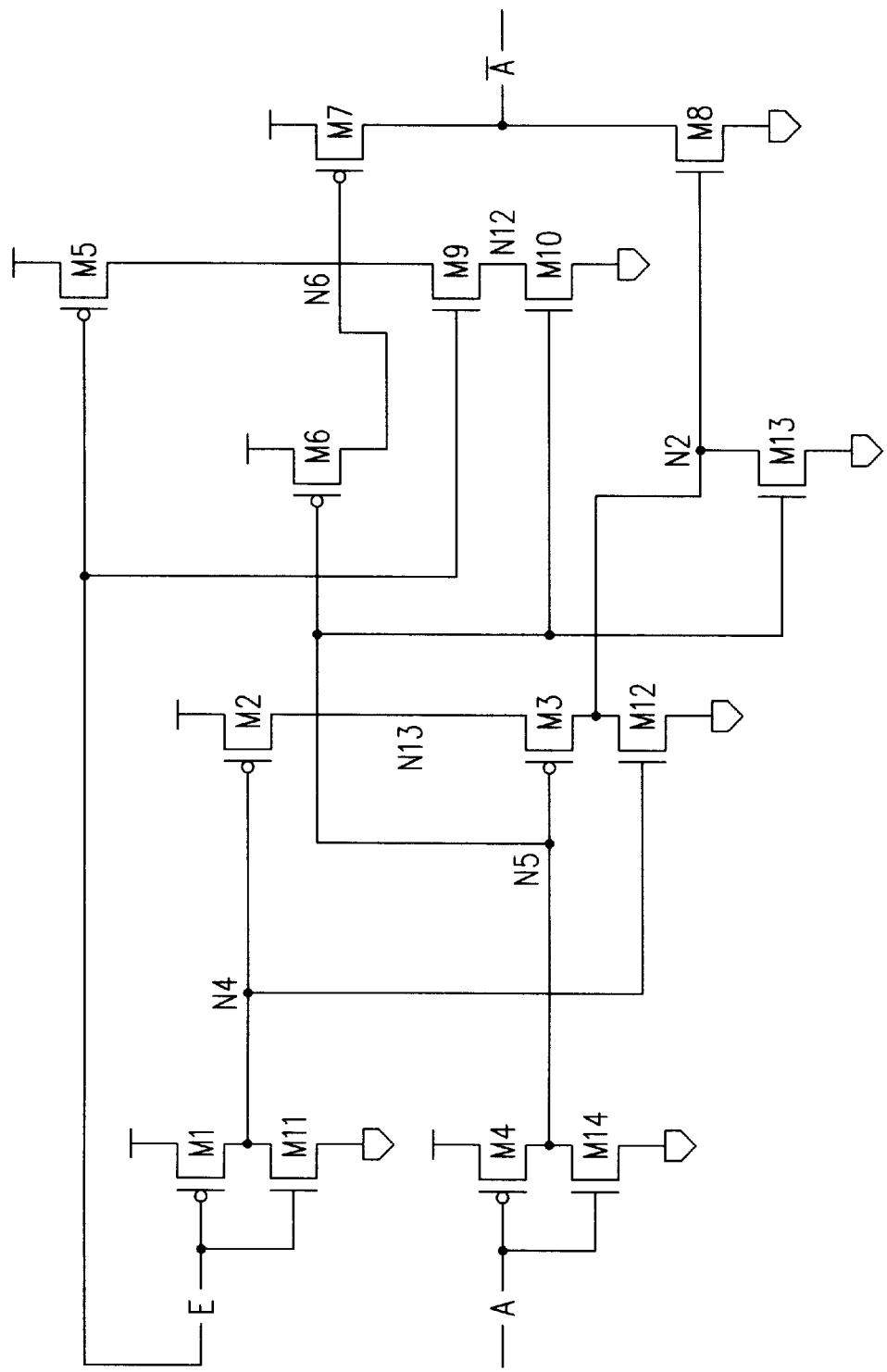
FIG. 3 illustrates the standard cell of FIG. 2.
Figure 4:
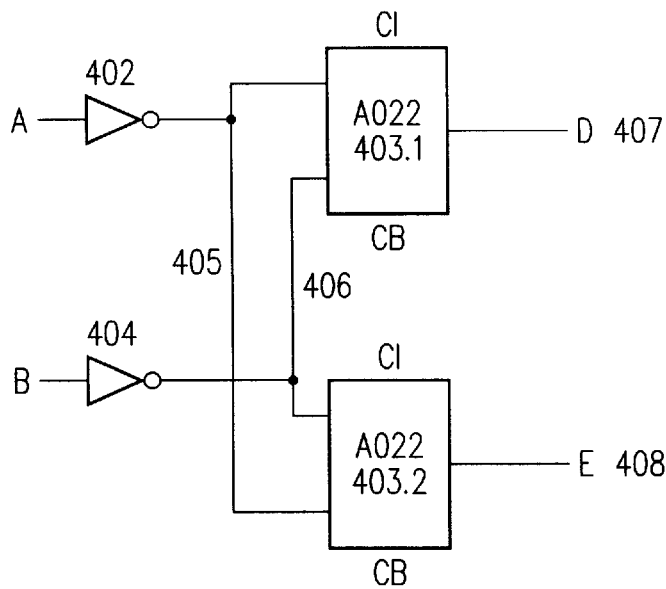
FIG. 4 illustrates a second prior art embodiment of a data port.
Figure 5:
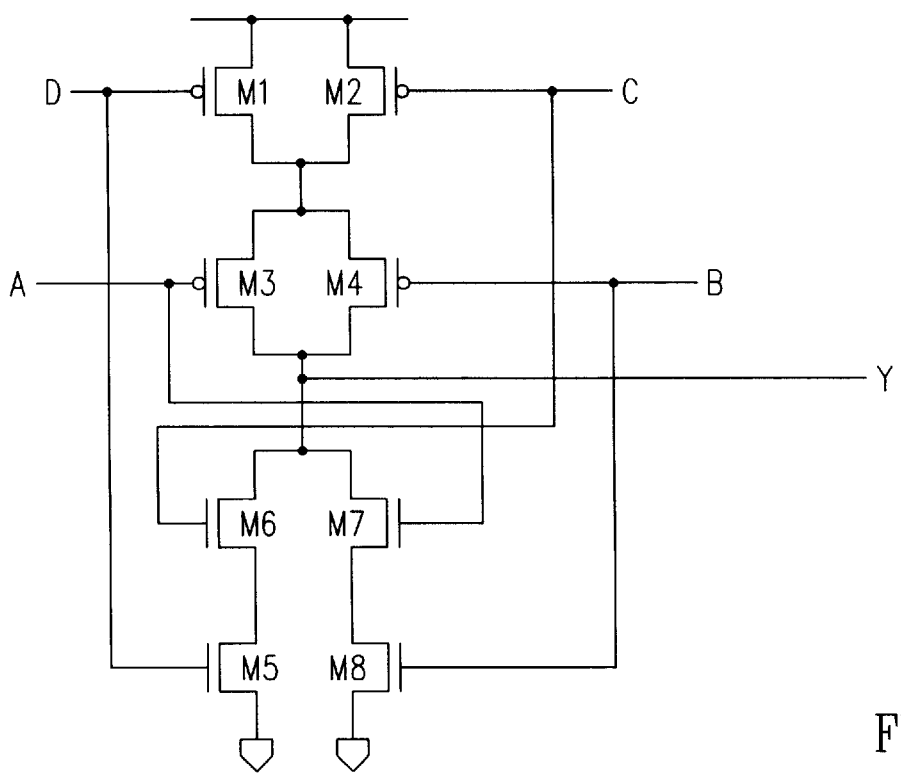
FIG. 5 illustrates the standard cell of Figure 4.
Figure 6:
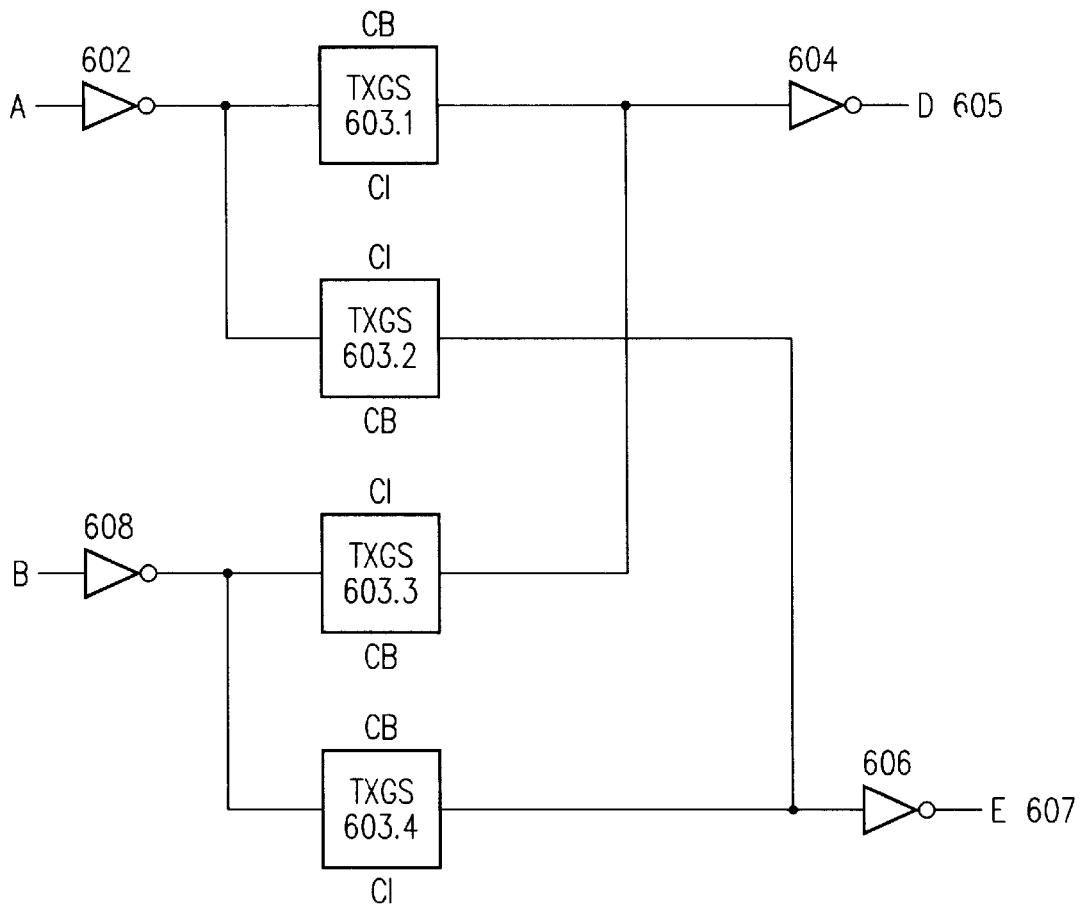
FIG. 6 illustrates an embodiment of a data port using the present invention.

The present invention provides a data port circuit with fewer transistors and higher performance than prior art schemes. A diagram of the data port of the present invention is illustrated in FIG. 6. The A input is coupled to cells 603.1 and 603.2. The output of cell 603.1 is coupled through inverter 604 to D output 605. The output of cell 603.2 is coupled through inverter 606 to E output 607.

The B input is coupled through inverter 608 to cells 603.3 and 603.4. The output of cell 603.3 is coupled through inverter 606 to E output 607. The output of cell 603.4 is coupled through inverter 604 to D output 606.

The cells are configured so that a high CI signal enables cells 603.1 and 603.3, and disables cells 603.2 and 603.4. This results in the A input being coupled to the D output 605 and the B input being coupled to the E output 607. Conversely a high CB signal enables cells 603.2 and 603.4, and disables cells 603.1 and 603.3. As a result, the A input is coupled to the E output 607 and the B input is coupled to the D output 605.

Figure 7:
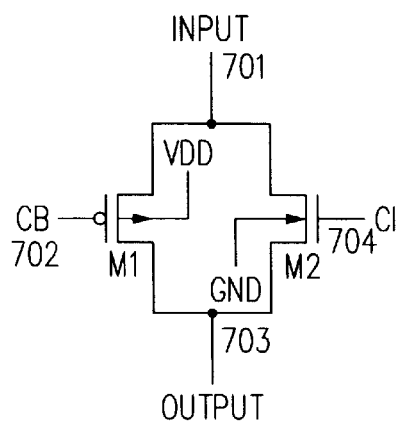
FIG. 7 illustrates the cell of FIG. 6.

A circuit diagram of the cells of FIG. 6 is illustrated in FIG. 7. The cell is a transmission gate and consists of transistors M1 and M2. Transistor M1 is a p type transistor with its source coupled to the drain of n type transistor M2 at input node 701. The drain of transistor M1 is coupled to the source of transistor M2 at output node 703. Transistor M1 has a substrate connection to VDD and transistor M2 has a substrate connection to ground. The gate of transistor M1 is coupled to signal CB and the gate of transistor M2 is coupled to signal CI. These signals are complementary so that both transistors are either open or closed. (The example shown corresponds to cells 603.1 and 603.4 of FIG. 6. CB and CI are reversed for cells 603.2 and 603.3). When CB is enabled, the transmission gate of FIG. 7 is open, permitting a signal to pass from input node 701 to output node 702. When CB is low, the gate is closed.

The present invention uses only twelve transistors including a perfect driver as opposed to 16 transistors with poor driver and 56 transistors of the prior art implementations. The circuit topology is inherently superior in area, speed, and transient power properties addressed as individual design criteria or as a whole.

In an alternate embodiment, a single n-type transistor is used instead of the transistor pair. This further reduces the transistor count, resulting in a simpler and faster circuit for the primary circuits and the C driver.

Although the invention has been described in connection with 2×2 ports, it has equal application to M×N×D ports. The principal circuit and topology can be a handcrafted hardware macro, as well as a software macro with a given vendor's device library. Ports and depths are scalable at the discretion of the designer based upon the silicon foundry vendor library, and constraints and objectives of the design or sub-design.

Circuit simulations have shown several orders of magnitude (e.g. 1000×) of improvement in area delay and power parameters are achievable over three generations of technology, including 0.35, 0.25 and 0.18 micron ruled based technologies. For a 2×2×256 port using 0.18 micron, benchmark performance is less than 200 ps for the data path, translating into a bandwidth of 640 GBPS (gigabytes per second). In other embodiments, ports can be of depth of 1024 and bandwidths of 5.0 terabytes per second can be achieved.

Thus, a data switch port is described in conjunction with one or more specific embodiments. The invention is defined by the claims and their full scope of equivalents.

What is claimed is:

1. A data switch port comprising:
   a first pair of transmission gates coupled to a first input signal and to first and second output lines, each of said first pair of transmission gates coupled to both first and second control signals such that only one of said first pair of transmission gates is enabled at a time;
   a second pair of transmission gates coupled to a second input signal and to said first and second output lines, each of said second pair of transmission gates coupled to both said first and second control signals such that only one of said second pair of transmission gates is enabled at a time;

said first and said second pairs of transmission gates configured such that said first input is coupled to said first output line and said second input is coupled to said second output line when said first control signal is enabled, and said first input is coupled to said second output line and said second input is coupled to said first output line when said second control signal is enabled.

2. The port of claim 1 wherein said first pair of transmission gates comprises first and second transmission gates.

3. The port of claim 2 wherein said first transmission gate comprises a p type transistor gate coupled to said first control signal and an n type transistor gate coupled to said second control signal.

4. The port of claim 3 wherein said second transmission gate comprises a p type transistor gate coupled to said second control signal and an n type transistor gate coupled to said first control signal.

5. The port of claim 4 wherein said first transmission gate is coupled to said first output line and said second transmission gate is coupled to said second output line.

6. The port of claim 2 wherein said first transmission gate comprises an n-type transistor.

* * * * *